(12) United States Patent
Ruda Y Witt et al.

(10) Patent No.: US 11,286,566 B2
(45) Date of Patent: Mar. 29, 2022

(54) APPARATUS FOR DEPOSITION OF A III-V SEMICONDUCTOR LAYER

(71) Applicant: AIXTRON SE, Herzogenrath (DE)

(72) Inventors: Francisco Ruda Y Witt, Eschweiler (DE); Markus Deufel, Aachen (DE); Marcel Kollberg, Würselen (DE)

(73) Assignee: AIXTRON SE, Herzogenrath (DE)

( * ) Notice: Subject to any disclaimer, the term of this patent is extended or adjusted under 35 U.S.C. 154(b) by 176 days.

(21) Appl. No.: 16/413,363

(22) Filed: May 15, 2019

(65) Prior Publication Data

US 2019/0264323 A1 Aug. 29, 2019

Related U.S. Application Data

(62) Division of application No. 15/010,603, filed on Jan. 29, 2016, now abandoned.

(30) Foreign Application Priority Data

Feb. 2, 2015 (DE) ...................... 10 2015 101 462.9

(51) Int. Cl.
*C23C 16/458* (2006.01)
*C23C 16/30* (2006.01)
(Continued)

(52) U.S. Cl.
CPC .......... *C23C 16/458* (2013.01); *C23C 16/303* (2013.01); *C23C 16/4405* (2013.01);
(Continued)

(58) Field of Classification Search
None
See application file for complete search history.

(56) References Cited

U.S. PATENT DOCUMENTS

2007/0128876 A1 6/2007 Fukiage
2008/0132040 A1 6/2008 Wang et al.
(Continued)

FOREIGN PATENT DOCUMENTS

DE 102008055582 A1 6/2010
DE 102011002145 A1 10/2012
(Continued)

OTHER PUBLICATIONS

Non-Final Office Action dated Aug. 10, 2018, for U.S. Appl. No. 15/010,603, filed Jan. 29, 2016, 9 pages.
(Continued)

*Primary Examiner* — Joel G Horning
(74) *Attorney, Agent, or Firm* — Ascenda Law Group, PC

(57) ABSTRACT

A III-V semiconductor layer is deposited using an apparatus comprising a process chamber, a susceptor for receiving one or more substrates to be coated, and a gas inlet element which comprises a plurality of process gas inlet zones. An etching gas inlet in the flow direction of the hydride and the MO compound opens into the process chamber downstream of the process gas inlet zones. A control device is adapted and the process gas inlet zones and the etching gas inlet are arranged such that the process gases cannot enter into the etching gas inlet during deposition of the semiconductor layer and the etching gas cannot enter into the process gas inlet zones during purification of the process chamber. The etching gas inlet is formed by an annular zone of the process chamber cover around the gas inlet element and by an annular fastening element for fastening a cover plate.

9 Claims, 4 Drawing Sheets

(51) Int. Cl.
 *C23C 16/44* (2006.01)
 *C23C 16/455* (2006.01)
 *H01L 21/02* (2006.01)

(52) U.S. Cl.
 CPC ........ *C23C 16/4408* (2013.01); *C23C 16/455* (2013.01); *H01L 21/0254* (2013.01); *H01L 21/0262* (2013.01)

(56) References Cited

U.S. PATENT DOCUMENTS

| | | | |
|---|---|---|---|
| 2010/0273290 A1 | 10/2010 | Kryliouk | |
| 2011/0117728 A1 | 5/2011 | Su et al. | |
| 2011/0294283 A1* | 12/2011 | Brien | C23C 16/4558 438/509 |
| 2016/0225619 A1 | 8/2016 | Ruda Y Witt et al. | |

FOREIGN PATENT DOCUMENTS

| | | |
|---|---|---|
| DE | 102011002146 A1 | 10/2012 |
| DE | 102012102661 A1 | 10/2013 |

OTHER PUBLICATIONS

Amendment filed Nov. 21, 2018, for U.S. Appl. No. 15/010,603, filed Jan. 29, 2016, 7 pages.
Final Office Action dated Mar. 8, 2019, for U.S. Appl. No. 15/010,603, filed Jan. 29, 2016, 10 pages.

\* cited by examiner

APPARATUS FOR DEPOSITION OF A III-V SEMICONDUCTOR LAYER

RELATED APPLICATIONS

This application is a Divisional Application of U.S. application Ser. No. 15/010,603, filed on 29 Jan. 2016 and incorporated herein by reference, which claims the priority benefit of DE Application No. 10 2015 101 462.9, filed 2 Feb. 2015.

BACKGROUND

DE 10 2011 002 145 A1, DE 10 2011 002 146 A1 and DE 10 2012 102 661 A1 describe a generic apparatus and a generic method. The apparatus is used to separate GaN layers by means of MOCVD. In this case, TMGa and $NH_3$ each diluted in a carrier gas comprising $H_2$ are fed through a gas inlet element disposed at the center of the process chamber into a process chamber having a circular outline. The susceptor forming the base of the process chamber is brought to a process temperature by a heater disposed underneath the susceptor. The process chamber cover is cooled by means of a cooling element. During the deposition the process gases decompose pyrolytically on the surfaces of the substrate so that a GaN layer is deposited there. It cannot be avoided that the free surfaces of the susceptor or the process chamber cover are covered with reaction products. These parasitic coverings of the process chamber cover and the susceptor must be removed in purification steps. An etching gas is used for this purpose. Preferably $Cl_2$ combined with a carrier gas which is then $N_2$ comes into consideration. In the generic apparatus the etching gas is supplied through one of the process gas inlet zones into the process chamber. As a result of adsorbates of the process gases adhering to the walls of the process gas supply lines and to the walls of the interior of the gas inlet element, an undesirable reaction takes place there between the residues of the process gases and the etching gas. Furthermore, reactions of the surfaces of the gas supply lines or the gas distribution chambers in the gas inlet element with the etching gas can occur. The resulting reaction products and in particular particles are disadvantageous.

SUMMARY OF THE INVENTION

The invention relates to an apparatus for deposition of a III-V semiconductor layer comprising a process chamber, a susceptor forming the base of the process chamber for receiving one or more substrates to be coated, a heater for heating the susceptor to a process temperature and a gas inlet element which comprises at least one first and one second process gas inlet zone, each for introducing process gases into the process chamber, wherein the first process gas inlet zone is connected to a hydride source which provides a hydride of the main group V as process gas and the second process gas inlet zone is connected to an MO source which provides a metalorganic compound of the main group III as process gas, wherein an etching gas inlet is connected to an etching gas source and wherein valves which can be switched by a control device and adjustable mass flow controllers are provided in order to introduce the hydride, the MO compound and the etching gas together with respectively one carrier gas in a mass-flow-controlled manner through a pipeline system into the process chamber.

The invention furthermore relates to a method for depositing a III-V semiconductor layer onto one or more substrates to be coated, which are received by a susceptor forming the base of a process chamber which susceptor is heated by a heater to a process temperature, wherein for deposition of the semiconductor layer, process gases are introduced into the process chamber in each case through first and a second process gas inlet zones of a gas inlet element, wherein a hydride of the main group V is introduced through a first process gas inlet zone and a metalorganic compound of the main group III is introduced through the second process gas inlet zone into the process chamber and wherein for purification of the process chamber after deposition of the semiconductor layer an etching gas is introduced through an etching gas inlet into the process chamber, wherein the mass flow of the process gases and the etching gas is controlled by mass flow controllers controlled by a control device.

It is the object of the invention to further develop the deposition method and the purification process which follows this in time as well as the apparatus used for this in a manner advantageous for use.

The object is solved by the invention specified in the claims, wherein the subclaims can not only form advantageous further developments of the equivalent claims but also independent solutions of the object.

Firstly and essentially a spatial separation of the etching gas inlet from the process gas inlet zones is provided. The process gas inlet zones can have a configuration as described in DE 10 2008 055 582 A1. The gas inlet element forms a gas inlet chamber which is closed by annular walls where the annular walls have a plurality of gas outlet openings located closely adjacent to one another. The latter form a pressure barrier which is beneficial to the uniform distribution of the process gases in the process chamber. The process gas flows, in particular the carrier gas flows with which the process gases are fed through the process gas inlet zones into the process chamber are adapted to a purge gas flow which flows into the process chamber through the etching gas inlet during the coating process in such a manner that no process gases can enter into the etching gas inlet and into the etching gas line disposed upstream of the etching gas inlet so that the walls of the etching gas supply line do not come in contact with the process gases. During the purification step, the gas flows, i.e., a purge gas flow passing through the process gas inlet zones and the etching gas flow entering through the etching gas inlet into the process chamber are matched to one another in such a manner that the etching gas cannot enter into the process gas supply line through the process gas inlet zones. The etching gas therefore does not come in contact with the walls of the process gas supply line. The apparatus according to the invention has a gas supply system which comprises a plurality of pipes which form a pipeline system. The pipes are closed with openable valves. Mass flow controllers are located in the pipes in order to control the process gas, purge or carrier gas or carrier gas/process gas mixture passing through the pipes in a mass-flow-controlled manner. The opening and closing of the valves and the adjustment of the mass flow values is made by an electronic control in a program-controlled manner. The pipeline system forms a pipeline connection of the process gas inlet zone with a respective process gas source or a pipeline connection of the etching gas inlet with an etching gas source. It is preferably provided that the process chamber has a circular outline. Located at the center of the process chamber is the gas inlet element which preferably extends over the entire height of the process chamber. The process gas inlet zones are located at various height positions. Three, four, five or more process gas inlet zones can be disposed one above the other. From the individual process gas inlet zones the respective process gas flows in the radial direction horizontally through the process chamber. Located on the radially outer edge of the process chamber is a gas outlet through which reaction products and the carrier gas can leave the process chamber. No etching gas is introduced into the process chamber through the process gas inlet zones. The etching gas is rather introduced through an etching gas inlet which is spatially separate from the process gas inlet zones. The etching gas inlet can comprise a plurality of openings through which the etching gas can flow together with a carrier gas. The etching gas inlet is preferably assigned to a zone extending annularly around the gas inlet element. The etching gas inlet zone is preferably formed by the process chamber cover and particularly preferably by a fastening element which holds at least one cover plate of the process chamber cover. The etching gas is preferably supplied through an etching gas inlet element which is spatially separate from the gas inlet element. The etching gas inlet element has the annular etching gas inlet zone which is formed by a plurality of openings. Through the etching gas inlet zone forming the etching gas inlet, the etching gas diluted in a carrier gas is introduced in the vertical direction, i.e., transversely to the radial flow of the process gas into the process chamber. It is in particular provided that the etching gas is introduced at an angle of 90° or less to the flow direction of the process gas into the process chamber. Preferably the etching gas is supplied from the cold side of the process chamber. The process gases are supplied to the gas inlet element through separate process gas supply lines which are located in a gas supply element located vertically above the gas inlet element. In a preferred embodiment, the gas supply element is surrounded by a casing body which has an etching gas supply line. The etching gas supply line opens into an annular gas distribution chamber which extends around the gas supply element. The etching gas diluted in a carrier gas can emerge from the gas distribution chamber through one or more gas passage openings preferably arranged in a uniform angular distribution. These openings act as pressure barriers. Located downstream of these openings is another distribution chamber which has gas passage openings which open into the etching gas inlet zones. The last-mentioned distribution chamber can be supplied by an additional purge gas flow. A pertinent purge gas supply line opens into another gas distribution chamber. GaN is deposited with the apparatus. To this end, $NH_3$ transported in an $H_2$ carrier gas and TMGa transported in an $H_2$ carrier gas are used as process gases. During the deposition process $H_2$ flows through the etching gas inlet. For purification of the process chamber $N_2$ flows through the process gas inlet zones. $N_2$ and $Cl_2$ flow through the etching gas inlet. During deposition of a semiconductor layer a purge gas flow flows through the etching gas inlet zone or through the resulting openings. The flow rate of the purge gas is selected in such a manner that the process gases can only diffuse slightly into the etching gas inlet openings. At most they enter into the distribution chamber purged by the purge gas. During the purification step a purge gas flows through the process gas inlet zone, i.e. the pertinent openings of the gas inlet element disposed closely adjacent to one another, at such a flow rate that the etching gas cannot diffuse as far as into the process gas distribution chamber located rearward of the process gas inlet openings. One or more pressure barriers are preferably arranged assigned to the etching gas supply line. Pressure barriers can be formed by gas passage openings having a correspondingly small cross-section so that upstream of the gas passage opening a significantly higher pressure is present in the etching gas supply line than downstream of the gas passage opening. One or more of these pressure barriers can be disposed downstream of a gas distribution chamber. The pressure barriers act as diffusion barriers from the process chamber in the direction of the gas distribution chambers.

BRIEF DESCRIPTION OF THE DRAWINGS

An exemplary embodiment of the invention is explained hereinafter with reference to appended drawings. In the figures.

DETAILED DESCRIPTION OF THE INVENTION

Figure 1:
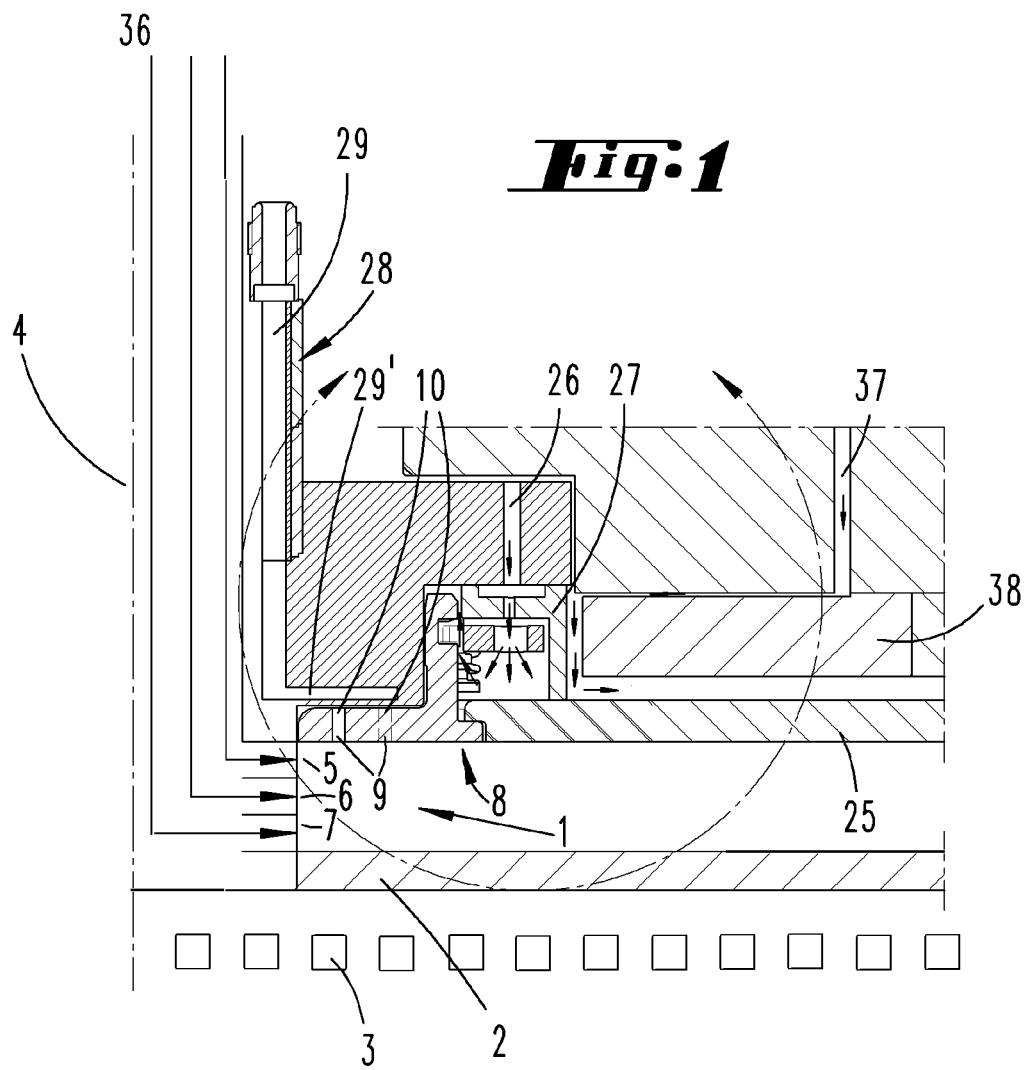
FIG. 1 shows similarly to FIG. 5 of DE 10 2008 055 582 A1 a cross-section through an apparatus according to the invention for the deposition of III-V semiconductor layers, where the cross-sectional plane shown is laid through an etching gas supply line 29.
Figure 2:
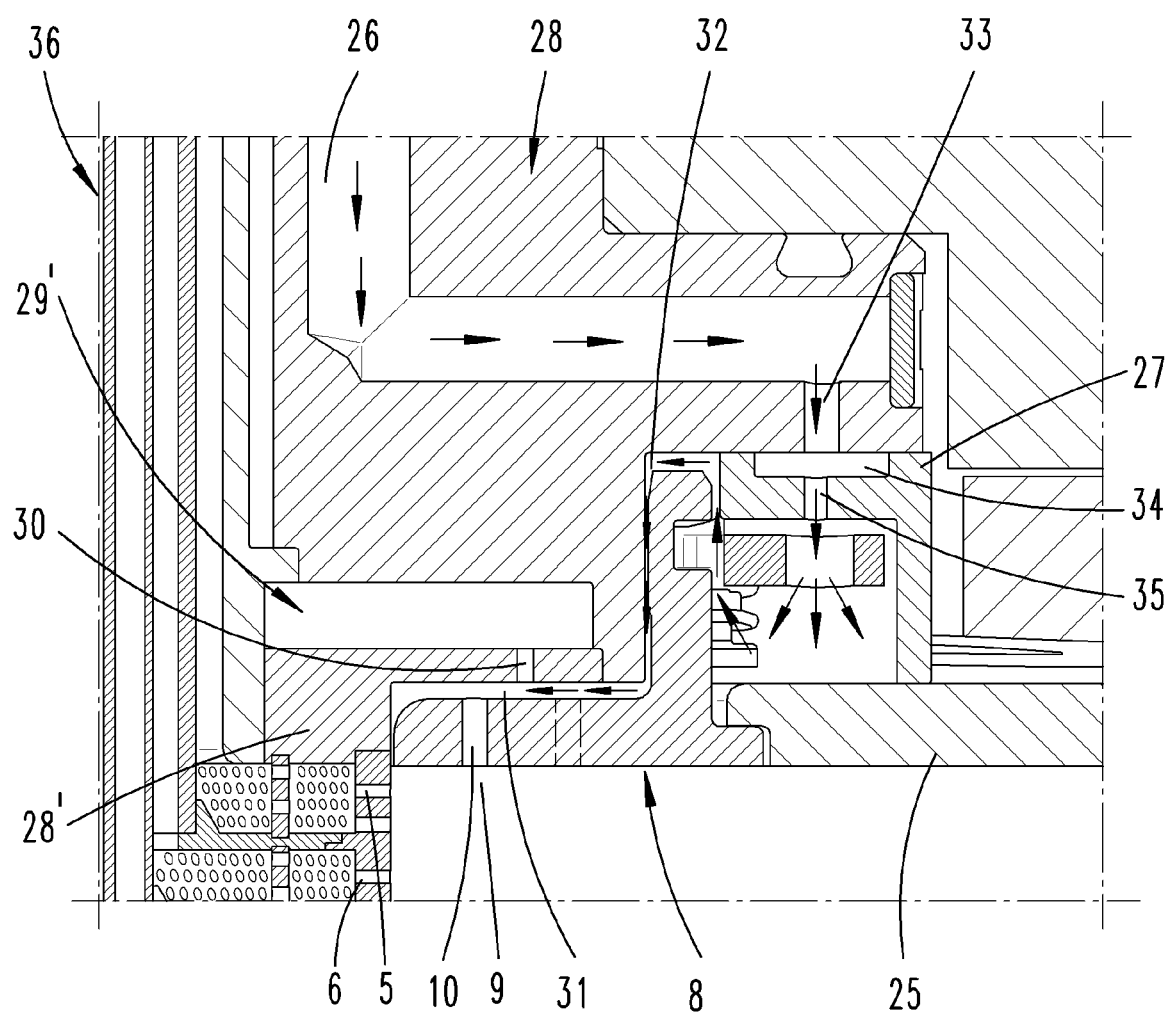
FIG. 2 shows a view according to FIG. 1 but enlarged and in a different cross-sectional plane in which a purge gas supply line 26 and a gas passage opening 30 are located.
Figure 3:
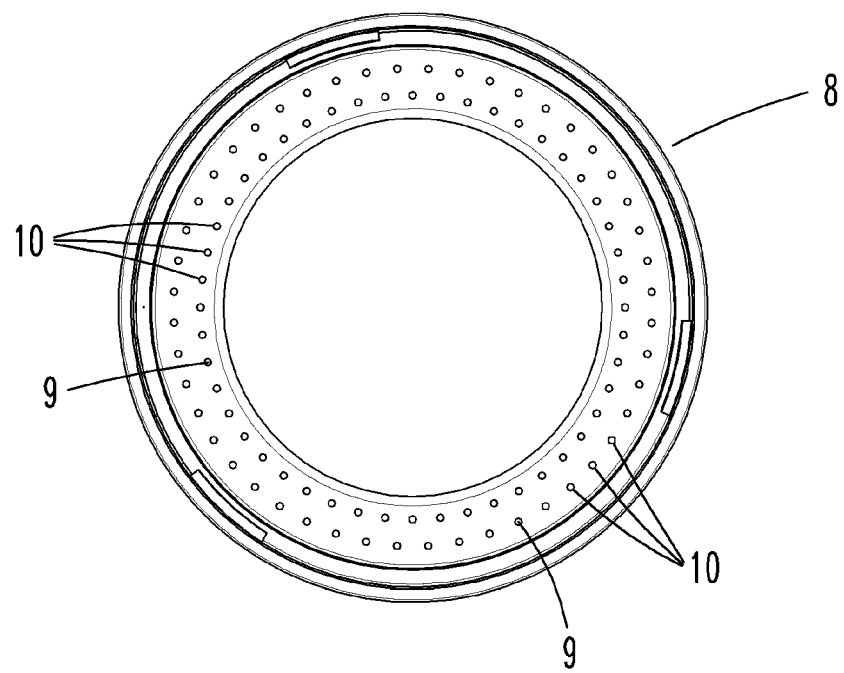
FIG. 3 shows a plan view of the etching gas inlet element 8 shown in section in FIGS. 1 and 2.
Figure 4:
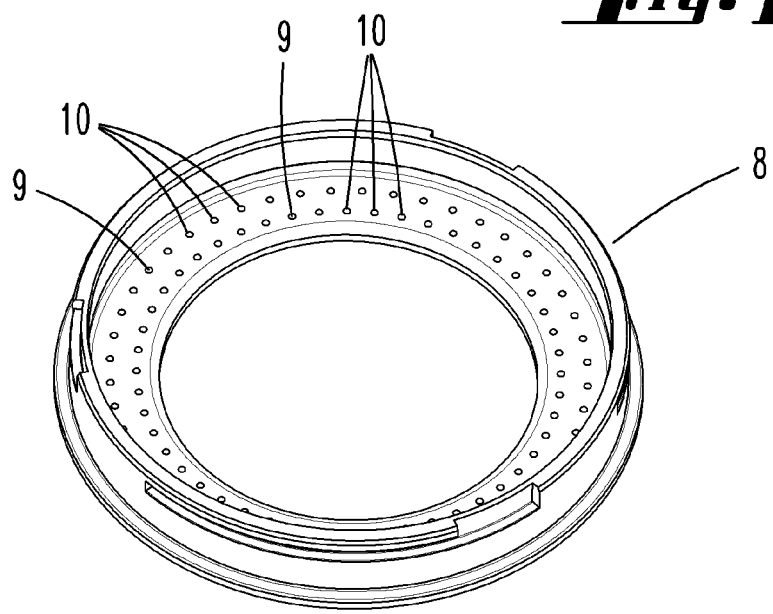
FIG. 4 shows the etching gas inlet element in a perspective view.
Figure 5:
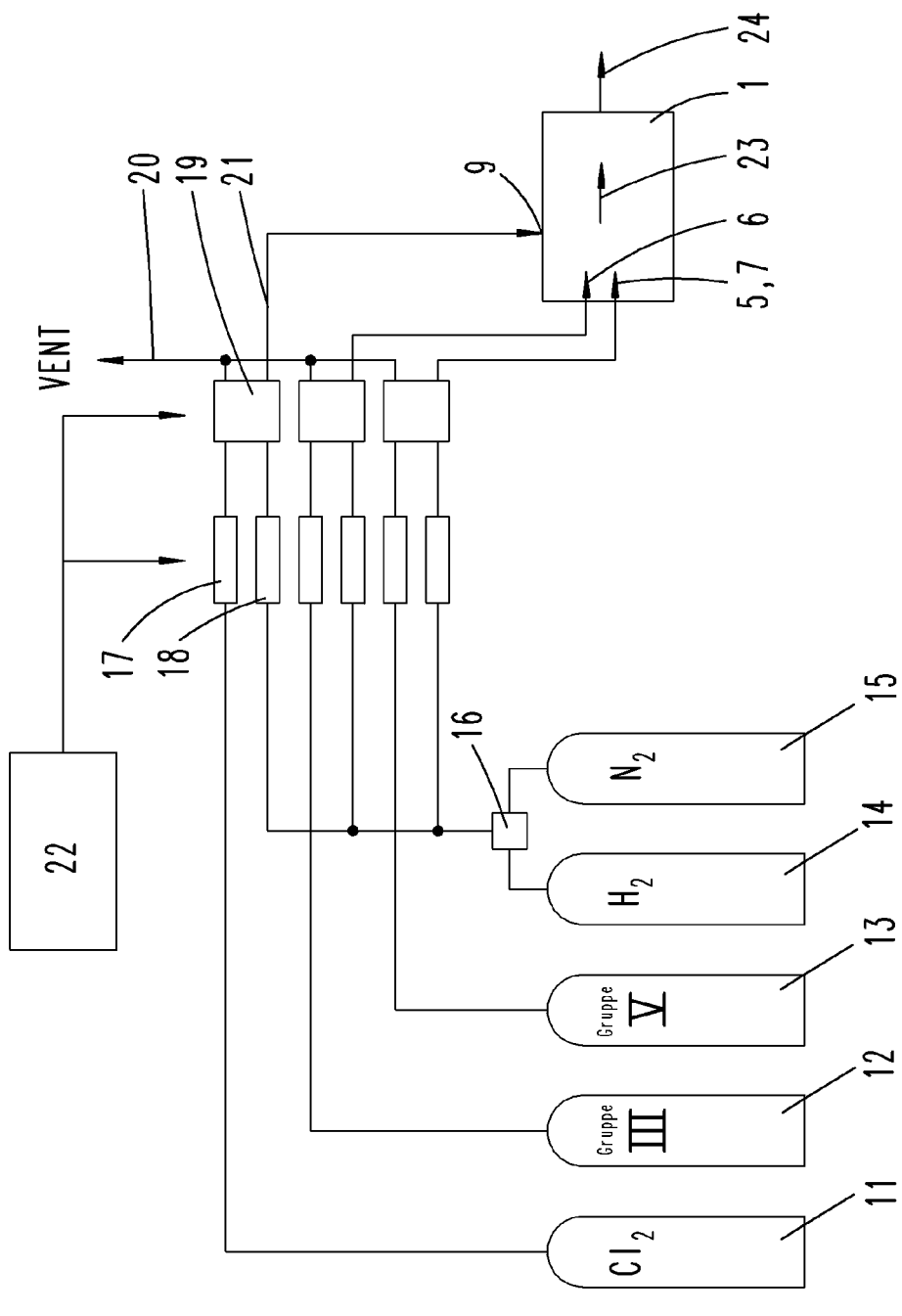
FIG. 5 shows the essential elements of a gas mixing system to explain the invention.

With regard to the configuration of the process chamber of the exemplary embodiment, reference is made to the descriptions of the initially mentioned prior art. The process chamber of the reactor has a circular outline with a gas outlet element 24 arranged radially on the outside, which is connected to a vacuum pump and a gas scrubber. Located at the center of process chamber 1 is a gas inlet element 4 as described in DE 10 2008 055 582 A1. The base of the process chamber 1 is formed by a susceptor 2 made, for example, of graphite on which the substrates to be coated are arranged. A heater 3 is provided underneath the susceptor 2, which can comprise a resistance heater of an IR heater or an RF heater. The upper side of the susceptor 2 facing the process chamber 1 is brought to a process temperature by means of the heater 3. The cover of the process chamber 1 is formed by one or more cover plates 25 which are cooled on the rear side thereof. A heat transfer body 38 is provided. A temperature-controlling gas which flows through a gap between cover plate 25 and heat transfer body 38 is fed through a temperature-controlling gas supply line 37. FIGS. 1 and 2 each show a cross-section through the central axis of the gas inlet element 4 which is identical to the center axis of the process chamber 1, wherein the sections of FIGS. 1 and 2 run offset at an angle.

The gas inlet element 4 has three process gas inlet zones 5, 6, 7 arranged vertically one above the other, which can each be supplied with a process gas by means of separate gas supply lines, where the process gases can be fed through a gas supply element 36. The gas supply element 36 located vertically above the gas inlet element 4 is surrounded by a casing body 28 which has a supply line 29 for an etching gas which lies in the sectional plane of FIG. 1. The supply line 29 is part of an etching gas supply device and opens into an annular chamber 29' which surrounds the gas supply element 36. The annular chamber 29' has a plurality of openings 30 distributed in uniform angular distribution over the entire circumference of the annular chamber, forming a pressure barrier. A gas supplied through the etching gas supply line 29 which can comprise an etching gas or a purge gas, emerges from these openings 30, from a section 28' of the casing body 28 into a distribution chamber 31 which also surrounds the gas supply element 36 in an annular manner. One wall of the distribution chamber 31 is formed by an outer wall of the casing body section 28' and another wall of the distribution chamber 31 is formed by an outer wall of an etching gas inlet element 8. The etching gas inlet element 8 has a plurality of bores 10 arranged in an annular zone around the gas inlet element 4, whose orifice forms an etching gas inlet 9. Two concentric rows of openings 10 are provided. However, only one row of openings 10 can also be provided. However, the number of concentric rows can also be more than two.

The etching gas inlet element 8 can comprise a fastening element which bears a cover plate 25. The fastening element 8 can be fastened to the process chamber cover or to the casing body 28 or to the gas supply element 36 by means of a bayonet closure.

The etching gas inlet zone 9 in which the etching gas inlet openings 10 are located is spatially separate from the gas inlet element 4. There is a radial spacing from the gas inlet element 4.

A purge gas line 26 is provided which is located inside the casing body 28 and which opens through an opening 33 into a distribution chamber 34 of an insulating body. The purge gas line 26 is offset at an angle to the etching gas supply line 29 relative to the center axis and is shown in FIG. 2. The insulating body is formed by an insulating ring 27 which is located radially outside the etching gas inlet element 8. The purge gas fed into the purge gas supply line 26 can emerge from the distribution chamber 34 in the direction of the process chamber 1 through an opening 35 which serves as a pressure barrier. In this case, the purge gas flow flows over a flange section of the etching gas inlet element 8 through an overflow channel 32 in order to flow into the distribution chamber 31 and flow together with the etching gas through the etching gas inlet openings 10 into the process chamber 1. A narrow gap between the etching gas inlet element 8 and the casing body 28 is purged with the purge gas which is fed through the purge gas supply line 26 but also with a purge gas which flows through the purge gas supply line 29 during the coating process.

An electronic control device 22 is provided which adjusts the mass flow values by mass flow controllers 17, 18. Changeover valves 16, 19 are also switched over by the control device 22. Thus, it is in particular provided to change with a changeover valve 16 between a purge gas from a source 14, for example $H_2$ and a purge gas from a source 15, for example $N_2$. The process gases are held ready in sources 12, 13. The TMGa source 12 is connected via mass flow controller and a changeover valve to a process gas inlet zone 6. The $NH_3$ source 13 is connected via mass flow regulators and a changeover valve to the process gas inlet zones 5, 7 so that the process gas and a carrier gas carrying this flows through the process gas inlet zones 5, 6, 7 in a flow direction 23 through the process chamber 1. The inlet zones 5, 6, 7 extend in an annular manner around the center axis of the gas inlet element 4 and upstream or radially inwards of the etching gas inlet zone 9. The process gas inlet zones 5, 6, 7 lie vertically above one another and have a plurality of small gas passage openings through which the respective process gas flows from a radially inner gas distribution chamber into the process chamber 1.

The carrier gas/process gas mixture can be switched by means of a changeover valve into a vent line 20 so that the gas flow does not flow through the process gas inlet zones 5, 6, 7.

The etching gas inlet 9 is connected to an etching gas supply line 21 by means of a changeover valve 19. By means of the changeover valve 19 a gas flow containing carrier gas which is mass-flow regulated by a mass flow regulator 18 and etching gas controlled by a mass flow regulator 17 is switched as desired into the supply line 21 or into the vent line 20. The feeding of the etching gas carrier gas mixture into the vent line 20 is accomplished downstream of the feeding of the process gases into the vent line 20.

During the layer growth process all the process gas inlet zones 5, 6, 7 and the etching gas inlet 9 are permanently purged with a gas, for example, $H_2$. In addition, the process gases are fed into the process chamber 1 through the process gas inlets 5, 6, 7. During the purification process all the process gas inlet zones 5, 6, 7 and the etching gas inlet 9 are also purged with a gas. $N_2$ flows through the process gas inlet zones 5, 6, 7. A mixture of $N_2$ and $Cl_2$ flows through the etching gas inlet 9. Before switching over from the growth process to the purification process and switching on the etching gas, the carrier gas is switched from $H_2$ to $N_2$ by means of the valve 16. Only then is a gas mixture of about 5 to 10 percent $Cl_2$ and 95 percent $N_2$ supplied via a pipe system into the distribution chamber 31 extending in a gas distribution plane, from where the etching gas flows from the openings 10 in the vertical direction into the process chamber 1. This comprises a distributor hole circle which comprises a total of 96 openings 10. The arrangement is selected so that an overpressure is only present in a gastight space and produces no parasitic flows in the system which could result in oxidation. In order to be able to further exclude any oxidation or etching gas diffusion, further structures such as deflecting plates or additional gas inlets can be used. It is also advantageous to use different materials for the inlets. It is thus provided that the gas supply element 36 consists of stainless steel, for example, Inconel. The casing body 28 can be made of the same material. Preferably, ceramics, quartz or also stainless steel are used for the insulating ring 27 and the etching gas inlet element 9. Furthermore, $SOCl_2$ can be used as purifying gas. The gas guidance is selected so that the gas inlets of the process gas inlet zone and the etching gas inlet meet approximately at an angle of 90° or less than 90°. The process gas inlet zone 5, 6, 7 and the etching gas inlet 9 can consist of different materials, but also of materials of the same group but with different alloys. The spatial separation of the introduction of the process gases and the etching gas into the process chamber 1 is designed so that calculations for the immediate vicinity of the gas inlet for the process gas show at least a reduction of the etching gas by five orders of magnitude in LOG 10.

The preceding explanations serve to explain the inventions covered overall by the application which further develop the prior art at least by the following feature combinations in each case also independently, namely:

An apparatus which is characterized in that the etching gas inlet 9 in the flow direction 23 of the hydride and the MO compound opens into the process chamber 1 downstream of the process gas inlet zones 5, 6, 7, wherein the control device 22 is adapted such that and the process gas inlet zones 5, 6, 7 and the etching gas inlet 9 are arranged such that the process gases emerging from the process gas inlet zones 5, 6, 7 cannot enter into the etching gas inlet 9 during deposition of the semiconductor layer and the etching gas emerging from the etching gas inlet 9 during purification of the process chamber cannot enter into the process gas inlet zones 5, 6, 7;

A method which is characterized in that the etching gas is fed into the process chamber 1 through an etching gas inlet 9 disposed in the flow direction of the hydride and the MO compound downstream of the process gas inlet zones 5, 6, 7, wherein during deposition of the semiconductor layer, the mass flows of the gases flowing through the process gas inlet zones 5, 6, 7 into the process chamber 1 and of a purge gas flowing through the etching gas inlet 9 into the process chamber 1 are adjusted so that the process gases do not enter into the etching gas inlet 9 and that during purification of the process chamber 1 the mass flows of the etching gas flow introduced through the etching gas inlet 9 into the process chamber 1 and the purge gas flows fed through the process gas inlet zones 5, 6, 7 into the process chamber 1 are adjusted in such a manner that no etching gas enters into the gas supply lines disposed upstream of the process gas inlet zones 5, 6, 7;

An apparatus which is characterized in that the process chamber 1 has a circular outline and the gas inlet element 4 is disposed in the center of the process chamber 1 and the etching gas inlet 9 is formed by an annular zone of the process chamber cover around the gas inlet element 4;

An apparatus which is characterized in that the annular zone of the etching gas inlet 9 is formed by an annular fastening element 8 for fastening a cover plate 25;

A method and/or an apparatus which is characterized in that the process gas inlet zones 5, 6, 7 are fed by gas supply lines which are formed by a gas supply element 36 disposed vertically above the gas inlet element 4, wherein the gas supply element 36 is surrounded by a casing body 28 which forms an etching gas supply line 29, 29';

A method and/or an apparatus which is characterized in that the etching gas supply line 29 opens into an annular channel 29' surrounding the gas supply element 36 which is connected to a distribution chamber 31 by a multiplicity of gas passage openings 30 distributed vertically over the entire circumference of the annular channel 29', wherein the openings 30 act as pressure barriers;

An apparatus which is characterized in that the distribution chamber 31 is an annular chamber which is in fluidic communication with the process chamber 1 with the gas passage openings 10 forming the etching gas inlet 9;

An apparatus which is characterized by a purge gas supply line 26 for supplying a purge gas into the distribution chamber 31;

A method which is characterized in that the etching gas is $Cl_2$ and the purge gas during the purification step is $N_2$;

A method which is characterized in that the process gases contain elements of the main group III and/or elements of the main group V and in particular are $NH_3$ and TMGa and the purge gas during layer deposition is $H_2$ or $N_2$;

An apparatus which is characterized by at least one pressure barrier in the etching gas supply line 29 which is in particular formed by a gas passage opening 30;

An apparatus which is characterized in that the pressure barrier 30 is disposed downstream of the gas distribution chamber 31.

All the disclosed features (in themselves and also in combination with one another) are essential to the invention. The disclosure of the application herewith also includes in its full content the disclosure content of the appurtenant/appended priority documents (copy of the prior application), also for the purpose of incorporating features of these documents in claims of the present application. The sub-claims with their features characterize independent inventive further developments of the prior art, in particular in order to make divisional applications on the basis of these claims.

REFERENCE LIST

1 Process chamber
2 Susceptor
3 Heater
4 Gas inlet element
5 Process gas inlet zone
6 Process gas inlet zone
7 Process gas inlet zone
8 Fastening element
9 Etching gas inlet
10 Gas passage opening
11 $Cl_2$ source
12 TMGa source, control device
13 $NH_3$ source
14 $H_2$ source
15 $N_2$ source
16 $N_2/H_2$ changeover valve
17 $Cl_2$ mass flow controller
18 $N_2/H_2$ mass flow controller
19 Changeover valve
20 Vent line
21 Supply line
22 Control device
23 Flow direction
24 Gas outlet
25 Cover plate
26 Purge gas supply line
27 Insulating ring
28 Casing body
29 Etching gas supply line
29' Etching gas supply line, annular channel
30 Gas passage opening
31 Distribution chamber
32 Overflow channel
33 Opening
34 Distribution chamber
35 Opening
36 Gas supply element
37 Temperature-controlling gas supply line
38 Heat transfer body

What is claimed is:

1. An apparatus for deposition of a III-V semiconductor layer, comprising:
a process chamber (1) with a circular outline;
a process chamber cover that covers the process chamber, the process chamber cover comprising a cover plate (25);
a susceptor (2) forming a base of the process chamber (1) for receiving one or more substrates to be coated, wherein a first surface of the cover plate (25) facing the process chamber (1) lies parallel to a first surface of the susceptor (2) facing the process chamber (1);
a heater (3) for heating the susceptor (2) to a process temperature;
a gas inlet element (4) which comprises a first and second process gas inlet zone (5, 6, 7), each for introducing process gases into the process chamber (1), wherein the first process gas inlet zone (5, 7) is connected to a hydride source (13) which provides a hydride of the main group V and the second process gas inlet zone (6) is connected to a metalorganic (MO) source (12) which provides an MO compound of the main group III, wherein the gas inlet element (4) is disposed in a center of the process chamber (1) and wherein the gas inlet element (4) extends over an entire height of the process chamber (1);

an etching gas inlet (9) for introducing an etching gas into the process chamber (1), wherein the etching gas inlet (9) is connected to an etching gas source (11), is formed by an annular zone of the process chamber cover around the gas inlet element (4), and is spatially separate from the first and second process gas inlet zones (5, 6, 7), wherein the annular zone of the etching gas inlet (9) is formed by an annular fastening element (8) for fastening the cover plate (25) of the process chamber cover, and wherein the annular fastening element (8) is located between the cover plate (25) and the gas inlet element (4), and separates the cover plate (25) from the gas inlet element (4);

valves (16, 19) that are switched by a control device (22); and adjustable mass flow controllers (17, 18) to introduce the hydride, the MO compound and the etching gas each together with respectively one carrier gas in a mass-flow-controlled manner through a pipeline system (21) into the process chamber (1), wherein the etching gas inlet (9) in a flow direction (23) of the hydride and the MO compound opens into the process chamber (1) downstream of the first and second process gas inlet zones (5, 6, 7), and wherein the control device (22) is adapted and the first and second process gas inlet zones (5, 6, 7) and the etching gas inlet (9) are arranged such that the process gases emerging from the first and second process gas inlet zones (5, 6, 7) cannot enter into the etching gas inlet (9) during deposition of the III-V semiconductor layer and the etching gas emerging from the etching gas inlet (9) during purification of the process chamber (1) cannot enter into the first and second process gas inlet zones (5, 6, 7).

2. The apparatus of claim 1, wherein the first and second process gas inlet zones (5, 6, 7) are fed by gas supply lines which are formed by a gas supply element (36) disposed vertically above the gas inlet element (4), and wherein the gas supply element (36) is surrounded by a casing body (28) which forms an etching gas supply line (29, 29').

3. The apparatus of claim 2, wherein the etching gas supply line (29) opens into an annular channel (29') surrounding the gas supply element (36), the annular channel (29') being connected to a distribution chamber (31) by a multiplicity of gas passage openings (30) distributed over an entire circumference of the annular channel (29'), wherein the openings (30) act as pressure barriers.

4. The apparatus of claim 3, wherein the distribution chamber (31) is an annular chamber which is fluidly coupled to the process chamber (1) via gas passage openings (10) forming the etching gas inlet (9).

5. The apparatus of claim 3, further comprising a purge gas supply line (26) for supplying a purge gas into the distribution chamber (31).

6. The apparatus of claim 4, wherein the gas passage openings (10) are disposed on a surface of the annular fastening element (8) that lies parallel to the first surface of the susceptor (2).

7. The apparatus of claim 2, further comprising at least one pressure barrier in the etching gas supply line (29) which is formed by a gas passage opening (30).

8. The apparatus of claim 7, wherein the gas passage opening (30) is disposed upstream of the distribution chamber (31).

9. The apparatus of claim 1, wherein the first and second process gas inlet zones (5, 6, 7) are disposed on a surface of the gas inlet element that lies perpendicular to the first surface of the susceptor (2).

* * * * *